United States Patent
Hollingsworth

(10) Patent No.: US 7,002,217 B2
(45) Date of Patent: Feb. 21, 2006

(54) ELECTROSTATIC DISCHARGE MITIGATION STRUCTURE AND METHODS THEREOF USING A DISSIPATIVE CAPACITOR WITH VOLTAGE DEPENDENT RESISTIVE MATERIAL

(75) Inventor: Tommy D. Hollingsworth, Leander, TX (US)

(73) Assignee: Solectron Corporation, Milpitas, CA (US)

( * ) Notice: Subject to any disclaimer, the term of this patent is extended or adjusted under 35 U.S.C. 154(b) by 82 days.

(21) Appl. No.: 10/866,544

(22) Filed: Jun. 12, 2004

(65) Prior Publication Data

US 2005/0275070 A1 Dec. 15, 2005

(51) Int. Cl.
*H03K 19/0185* (2006.01)

(52) U.S. Cl. .................. 257/355; 257/358; 257/363; 365/80; 365/81

(58) Field of Classification Search ............... 257/355, 257/358, 363; 356/80, 81
See application file for complete search history.

(56) References Cited

U.S. PATENT DOCUMENTS

| | | |
|---|---|---|
| 5,185,654 A | 2/1993 | Mosher et al. |
| 5,478,616 A | 12/1995 | Kochem et al. |
| 5,789,999 A | 8/1998 | Barnett et al. |
| 5,955,762 A | 9/1999 | Hively |
| 6,352,654 B1 | 3/2002 | Silvi et al. |
| 6,492,715 B1 | 12/2002 | Markovich et al. |
| 6,599,808 B1 | 7/2003 | Kim et al. |
| 2003/0025180 A1 | 2/2003 | Alcoe et al. |
| 2003/0174461 A1 | 9/2003 | Takatani et al. |
| 2004/0016928 A1 | 1/2004 | Ravi et al. |

OTHER PUBLICATIONS

Robert L. Benson, Suneer V. Patel, Coping with ESD, Exploring ESD Thermoformable Packaging Materials, ESD Thermoformable Packaging Materials: An Overview, unknown publication date, pp. 1-6, unknown publisher, US.
Polymer ESD Suppressors With SurgX Technology, Cooper Electronic Technologies, unknown publication date, pp. 1-4, unknown pubisher, US.

(Continued)

*Primary Examiner*—Fetsum Abraham
(74) *Attorney, Agent, or Firm*—Robert Moll

(57) ABSTRACT

The present invention relates to structures and methods that reduce ESD damage to electronic devices. In an embodiment, the structure is a parallel plate dissipative capacitor formed by sandwiching a dissipative dielectric layer between two conductive layers in series to the electronic device. The dissipative dielectric layer includes a nonconductive dielectric doped with a voltage dependent resistive material that defines a conductive threshold voltage. The structure functions as a voltage dependent resistor in response to an applied voltage such as an ESD surge voltage exceeding the defined conductive threshold voltage and dissipates the applied voltage into thermal energy before it can reach the electronic device and cause damage. The dissipative dielectric layer restores to a dielectric and the structure functions as a capacitor when the excess voltage is depleted that is drops below the defined conductive threshold voltage. In another embodiment, the structure is a parallel plate dissipative capacitors in series that enhances ESD mitigation through a capacitive voltage divider structure. The structures can be used in EMI/RFI shielding applications.

13 Claims, 3 Drawing Sheets

OTHER PUBLICATIONS

Carbon Nanotubes for Static Dissipation, Solutions for Static Control, Plastics Additives & Compounding, The International Magazine for Users of Additives, Sep. 2001, pp. 1-3, vol. 3 Issue 9 ISSN 1464-391X, Elsevier, Cambridge, US.

Hyperion is a Catalyst for Success at Johnson Matthey, unknown publication, unknown publication date, unknown publisher, unknown country.

Ray H. Baughman, Anvar A Zakhidov, Walt A. de Heer, Carbon Nanotubes—The Route Toward Applications, Aug. 2, 2002, pp. 787-792, vol. 297, Science, US.

ELECTROSTATIC DISCHARGE MITIGATION STRUCTURE AND METHODS THEREOF USING A DISSIPATIVE CAPACITOR WITH VOLTAGE DEPENDENT RESISTIVE MATERIAL

BACKGROUND

The present invention relates to structures and methods that reduce damage from electrostatic discharge and/or shield against electromagnetic and radio frequency interference.

In electronic manufacturing, a worker may develop electrostatic charge from touching or rubbing surfaces as he works. Electrostatic discharge (ESD) from the worker to an electronic device can damage it. Grounding the machines, the worker, the walls, and the floor as well as controlling humidity will help, but not eliminate ESD damage especially if the device is transported around the factories.

Sensitivity to ESD damage increases as electronic devices such as semiconductors shrink in size. For example, if semiconductors have submicron size conductive channels, even tenths of a volt can cause a surge current that exceeds channel current capacity and fuses the channels.

It would be desirable to have structures and methods to reduce ESD damage especially during transportation and handling of electronic devices and if the structures and methods could be used to shield against electromagnetic interference (EMI) and radio frequency interference (RFI).

SUMMARY OF THE INVENTION

The present invention relates to structures and methods to reduce ESD damage and shield against EMI and RFI. By placing one or more parallel plate capacitors adjacent an electronic device the invention places one or more capacitors in series with the current flowing through the electronic device when there is ESD. The capacitance acts as a capacitive voltage divider to the ESD. After the discharge, the dissipative characteristics of the lossy dielectric of the physical structure cause the transferred electrical energy to be converted to thermal energy. The structure can be also used to reduce EMI/RFI.

DETAILED DESCRIPTION OF THE PREFERRED EMBODIMENTS

Figure 1A:
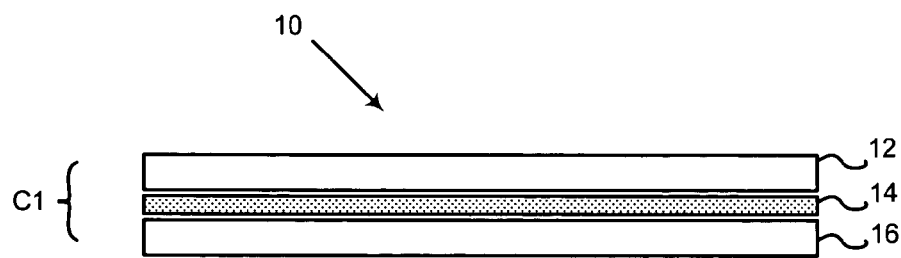
FIG. 1A illustrates a structure made of a parallel plate dissipative capacitor that reduces ESD damage.

The following description includes the best mode of carrying out the invention. The detailed description is made for the purpose of illustrating the general principles of the invention and should not be taken in a limiting sense. The scope of the invention is best determined by reference to the claims.

We assign each part, even if structurally identical to another part, a unique reference number wherever that part appears in the drawings. A dashed circle indicates a part of a figure that is enlarged in another figure. The reference number tied to the dashed circle indicates the figure showing the enlarged portion.

FIG. 1A illustrates a structure made of a parallel plate dissipative capacitor that will reduce ESD damage. In an embodiment, a structure 10 is a parallel plate dissipative capacitor C1 formed by sandwiching a dissipative dielectric layer 14 between a first conductive layer 12 and a second conductive layer 16.

In the embodiment, the dissipative dielectric layer 14 includes a nonconductive dielectric doped with a voltage dependent resistive material that defines a conductive threshold voltage in the dissipative dielectric layer 14. Some suitable nonconductive dielectrics include Mylar, polyethylene, polycarbonate, glass fiber laminates, plastic and paper fibers. One suitable voltage dependent resistive material is carbon nanotubes manufactured by Hyperion Catalysis International, Cambridge, Mass. In an embodiment, the carbon nanotubes are preferably 1.5–4.5% by weight of the dissipative dielectric layer 14. Carbon nanotubes are electrically conductive polymers with a high aspect ratio. Electrical conductivity in the dissipative dielectric layer 14 is achieved through a quantum mechanism rather than through direct particle to particle contact thus exhibiting a nonlinear current voltage relationship (i.e., a non-ohmic relationship). *Carbon Nanotubes for Static Dissipation*, in Plastic Additives & Compounding, September 2001, volume 3, issue 9, published by Elsevier, describes the characteristics and properties of carbon nanotubes, which is incorporated herein by reference.

The concentration of the voltage dependent resistive material in the nonconductive dielectric defines the conductive threshold voltage of the parallel plate dissipative capacitor C1. An ESD voltage that exceeds the conductive threshold voltage applied across first and second conductive layers 12 and 16 makes the dissipative dielectric layer 14 conductive. The resistance of the dissipative dielectric layer 14 decreases nonlinearly with increase in the ESD voltage. The ESD voltage is dissipated into thermal energy through current conduction in the dissipative dielectric layer 14 until the ESD voltage is depleted or removed and the parallel plate dissipative capacitor C1 restores its capacitive function.

In other embodiments, low cost materials such as FR1, FR2 and unfired ceramics may be used instead of doping a nonconductive dielectric with a voltage dependent resistive material. Such low cost materials exhibit inherent nonconductive dielectric and voltage dependent resistive characteristics with an associated conductive threshold voltage.

Figure 1B:
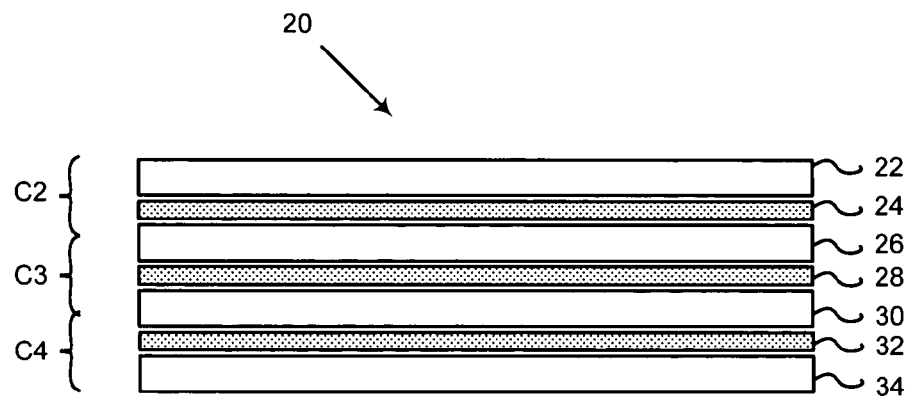
FIG. 1B illustrates a structure made of parallel plate dissipative capacitors in series that reduce ESD damage.

FIG. 1B illustrates a structure made of parallel plate dissipative capacitors in series that will further reduce ESD damage. The capacitors are made as described above in connection with FIG. 1A. In this embodiment, the structure 20 is made of capacitors C2, C3 and C4. Conductive layers 22 and 26 sandwich dissipative dielectric layer 24 to form capacitor C2. Conductive layers 26 and 30 sandwich dissipative dielectric layer 28 to form capacitor C3. Conductive layers 30 and 34 sandwich dissipative dielectric layer 32 to form capacitor C4.

The concentration of the voltage dependent resistive material defines the conductive threshold voltage. In an embodiment, the concentration of the carbon nanotubes is preferably 1.5–4.5% of the total weight of each of the dissipative dielectric layers 24, 28, and 32. The capacitance value which is a function of the dielectric properties and concentration of the voltage dependent resistive material defines a suitable thickness (e.g., 1–5 mils) for the dissipative dielectric layers 24, 28 and 32. The dissipative dielectric layer should be thin to better transfer the dissipated thermal energy to the adjacent conductors or to a heat sink.

Figure 1C:
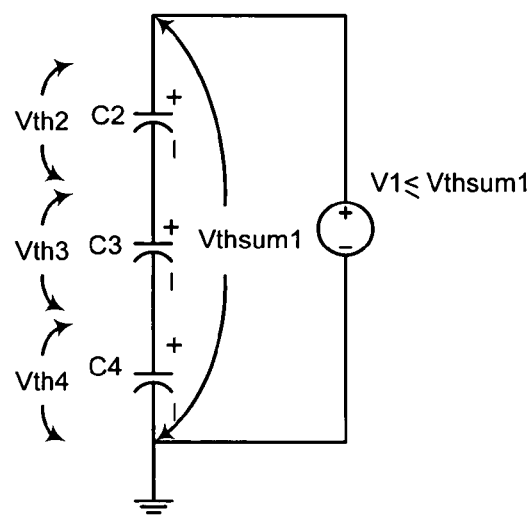
FIG. 1C is an electrical model of the structure of FIG. 1B in a nonconductive state.

FIG. 1C is an electrical model of the structure 20 of FIG. 1B made of parallel plate dissipative capacitors in series in a nonconductive state. In nonconductive state, the structure 20 has a return path connected to the ground for series capacitors C2, C3, and C4. If applied voltage V1 is across the capacitors C2, C3, and C4, the total capacitance of the capacitors C2, C3, and C4 is expressed by:

$$1/Ctotal_1 = 1/C2 + 1/C3 + 1/C4$$

If capacitors C2 C3 and C4 are identical, the $Ctotal_1$ value is reduced to ⅓ of, e.g., capacitor C2:

$$Ctotal_1 = \frac{1}{3} \times C2, \text{ when } C2 = C3 = C4$$

Each dissipative dielectric layers 24, 28 and 32 (FIG. 1B) is a voltage divider and therefore dissipates ⅓ of the applied voltage V1. If there are N capacitors in series that are identical, each capacitor will dissipate 1/N of the applied voltage V1. The greater the number of capacitors in series, the smaller the voltage each capacitor has to dissipate. The ability of the dielectric layers to conduct heat to a heat sink as described in FIG. 1B limits the number of dissipative dielectric layers used in the structure 20.

The conductive threshold voltage Vthsum1 of the structure 20 is the sum of the conductive threshold voltages Vth2, Vth3, and Vth4 of capacitors C2, C3 and C4, expressed:

$$Vthsum1 = Vth2 + Vth3 + Vth4$$

If the applied voltage V1 is equal or less than the sum of the conductive threshold voltage, Vthsum1, capacitors C2, C3, and C4 remain in a nonconductive state and act as capacitors:

If V1<Vthsum1, C2, C3, and C4 are capacitive.

Figure 1D:
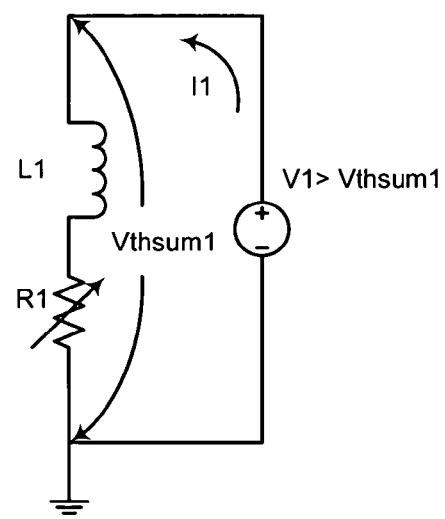
FIG. 1D is an electrical model of the structure of FIG. 1B in a conductive state.

FIG. 1D is an electrical model of the structure 20 of FIG. 1B made of parallel plate dissipative capacitors in series in the conductive state. If the applied voltage V1 is greater than the conductive threshold voltage Vthsum1, the capacitors C2, C3, and C4 act not as capacitors but as a voltage dependent resistor R1:

If V1>Vthsum1, C2, C3, and C4 act as a voltage dependent resistor R1.

Excess voltage ΔV1 is the difference between the applied voltage V1 and the conductive threshold voltage Vthsum1, expressed:

$$V1 - Vthsum1 = \Delta V1 \text{ excess voltage}$$

Electrical conductivity in dissipative dielectric layers 24, 28 and 32 is achieved through quantum mechanism at excess voltage ΔV1. The voltage dependent resistor R1 exhibits resistance that is inversely proportional to the excess voltage ΔV1. Capacitors C2, C3, and C4 can be modeled by a voltage dependent resistor R1 in series with a small inductor L1 where the current I1 is proportional to the differential change of the excess voltage ΔV1 over time, expressed:

$$I1 = Ctotal_1 \times d\Delta V1/dT$$

The current I1 flows through the structure 20 from the conductive layer 22 to the conductive layer 34 or vice versa depending on the voltage polarity across the structure 20 (FIG. 1B). The excess voltage ΔV1 is dissipated into thermal energy in the dissipative dielectric layers 24, 28 and 32, and decreases over time following a RC time constant exponential decay relationship until ΔV1 is depleted.

Figure 2A:
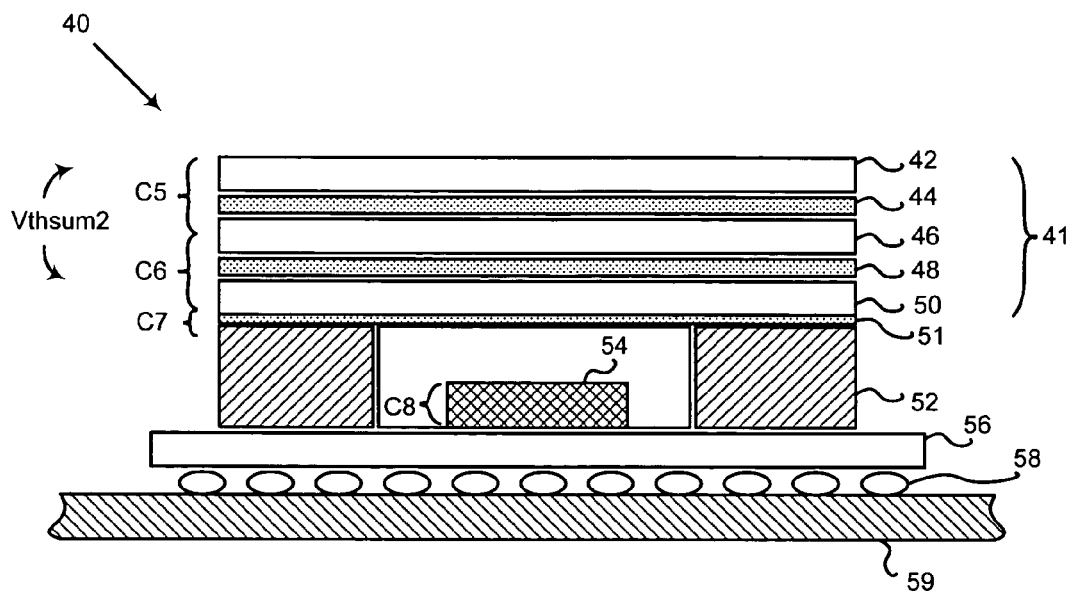
FIG. 2A illustrates a BGA package lid made of parallel plate dissipative capacitors in series.

FIG. 2A illustrates a ball grid array (BGA) package 40 with a lid 41 made of parallel plate dissipative capacitors in series. The lid 41 includes parallel plate dissipative capacitors C5 and C6 in series in a range of 100 pF to 1000 pF such as 500 pF. Capacitors C5 and C6 have dissipative dielectric layers 44 and 48 sandwiched by conductive layers 42, 46 and 50 with a total conductive threshold voltage Vthsum2. The lid 41 seals the stiffener 52 with an adhesive 51. The stiffener 52 is the body of the BGA package that is made of conductive structure such as aluminum or copper. Capacitor C7 has a value of 500 pF and is formed by the dielectric layer of the adhesive 51 sandwiched between the conductive layer 50 and the stiffener 52. The stiffener 52 is brazed to the interposer 56, i.e., the BGA substrate, and the BGA package 40 is attached to the printed wired board (PWB) 59 through the melted solder ball 58 in the bottom of the interposer 56. A semiconductor device 54 is brazed onto the interposer 56. Capacitor C8 with a value of less than 300 pF is formed by the top and bottom metallization of the semiconductor device 54. The value of capacitor C8 is usually small compared to the capacitors C5 and C6 of the lid 41. Capacitors C5 and C6 are in series to the capacitors C7 and C8.

Figure 2B:
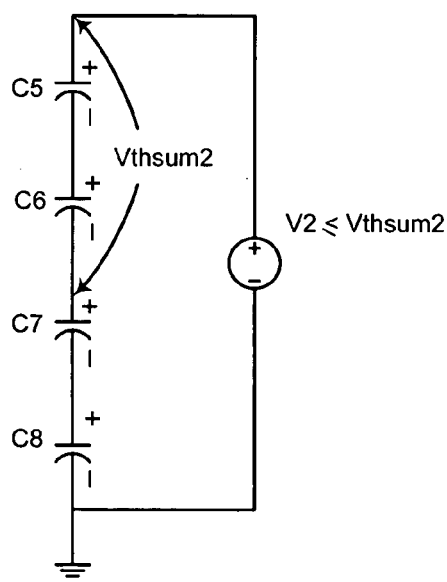
FIG. 2B is an electrical model of the BGA package lid of FIG. 2A in nonconductive state.

FIG. 2B is an electrical model of the BGA package 40 shown in FIG. 2A in a nonconductive state with an applied voltage V2 less than or equal to the conductive threshold voltage Vthsum2. The total capacitance seen by the device 54 is:

$$1/Ctotal_2 = 1/C5 + 1/C6 + 1/C7 + 1/C8$$

The series capacitors C5 to C8 form a voltage divider circuit where the voltage across each capacitor is inversely proportional to its capacitance.

Figure 2C:
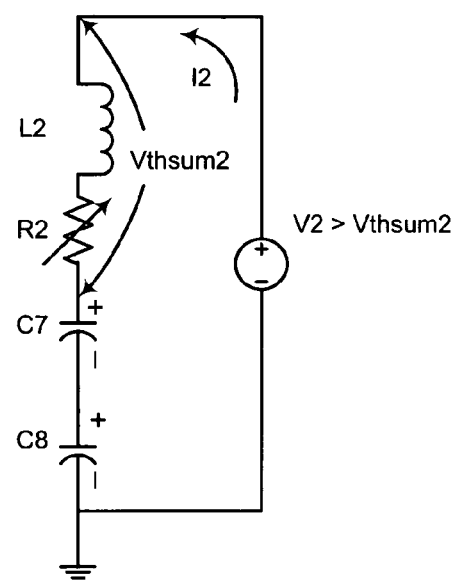
FIG. 2C is an electrical model of the BGA package lid of FIG. 2A in conductive state.

FIG. 2C is an electrical model of the BGA package 40 shown in FIG. 2A in a conductive state with an applied voltage V2 greater than the conductive threshold voltage Vthsum2. The difference is the excess voltage ΔV2 as follows:

$$V2 - Vthsum2 = \Delta V2 \text{ (excess voltage)}$$

Under this condition, the capacitors C5 and C6 are modeled as a voltage dependent resistor R2 with an illustrative value of 10 k ohm with a series inductance L2 with a value of 0.3 nH and capacitors C7 and C8 are relatively nonconductive. The current I2 is proportional to the differential change of the excess voltage ΔV2 over time until V2 is less than or equal to conductive threshold voltage Vthsum2:

$$I2 = (Ctotal_2) \times d\Delta V2/dT$$

For example, if the voltage dependent resistor R2 is about 10 k ohm, capacitor C7 is about 500 pF and capacitor C8 is about 300 pF, the RC time constant is less than 2 micro second. The excess voltage ΔV2 is dissipated into thermal energy and decreases with exponential decay following an RC time constant in the dissipative dielectric layers 44 and 48. The generated heat is conducted from the lid 41 to the PWB 59 through the stiffener 52 and to the interposer 56.

Figure 3A:
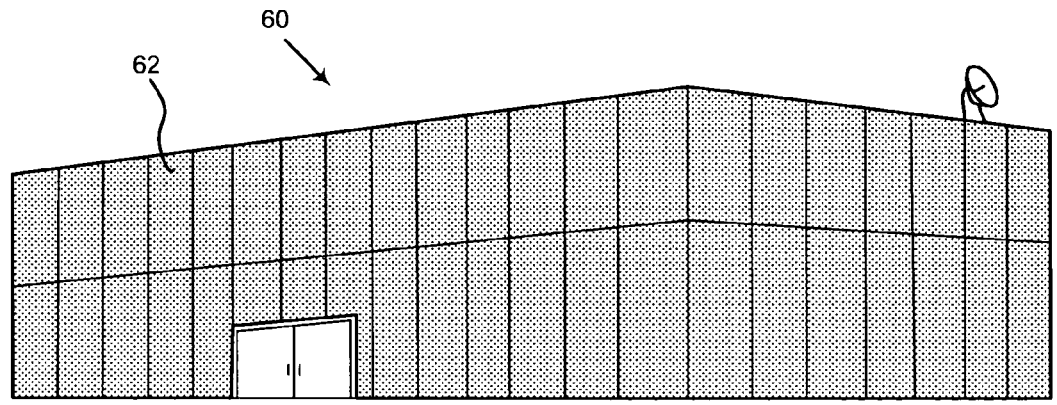
FIG. 3A illustrates using a structure as an EMI/RFI shield for a building.

FIG. 3A illustrates using the structures of FIG. 1A or FIG. 1B as an EMI/RFI shield. A structure 62 is laminated using known adhesives and/or pressure on each of the windows of a building 60. The EMI/RFI shield that results improves wireless LAN communication security where microwave and radio frequencies would penetrate the building without the EMI/RFI shield. The radiated energy can be reduced by the dissipative dielectric layer of the structure 62.

Figure 3B:
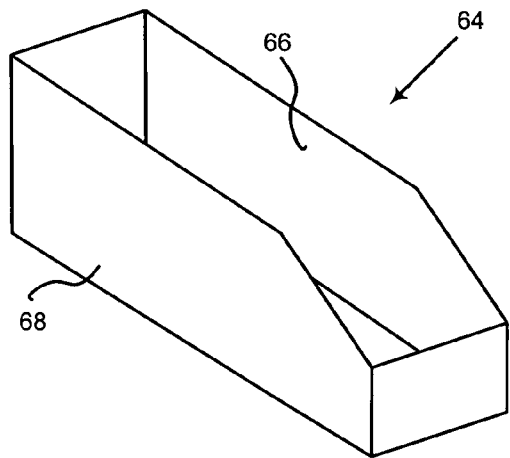
FIG. 3B illustrates using a structure for an antistatic container.
Figure 3C:
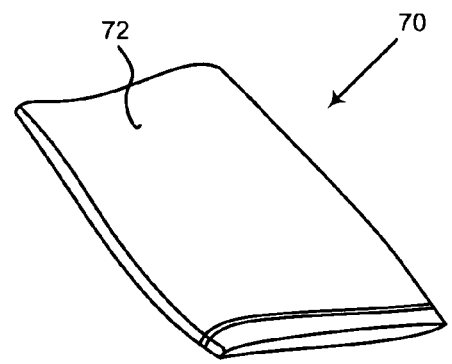
FIG. 3C illustrates using a structure for an antistatic bag.

FIGS. 3B–3C illustrate using the structures of FIG. 1A or 1B as an antistatic container 64 and an antistatic bag 70 for transporting electronic devices. The structures can also form the interior surface 66 and the exterior surfaces 68, 72 on some rigid or flexible material. The antistatic container 64 and an antistatic bag 70 act as a Faraday cage to shield and dissipate the ESD voltage to prevent ESD damage to the electronic devices inside.

Figure 3D:
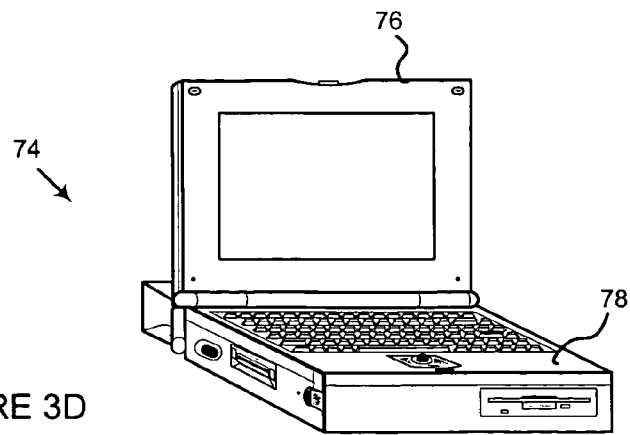
FIG. 3D illustrates using a structure for an enclosure of a notebook computer.

FIG. 3D illustrates using the structure of FIG. 1A or FIG. 1B for an enclosure adjacent or part of the monitor enclosure 76 and the enclosure case 78 of a notebook computer 74. This allows ESD mitigation to the components in the notebook computer 74 as well EMI/RFI shielding.

What is claimed is:

1. A ESD mitigation structure, comprising:
a parallel plate dissipative capacitor with a conductive threshold voltage in series to an electronic device forming a voltage divider to the electronic device, wherein the dissipative capacitor includes a first conductive layer and a second conductive layer that sandwich a dissipative dielectric layer, wherein the dissipative dielectric layer includes a nonconductive dielectric doped with a voltage dependent resistive material, wherein the concentration of the voltage dependent resistive material defines the conductive threshold voltage, and wherein the ESD damage is mitigated when an excess voltage above the conductive threshold voltage is applied to the parallel plate dissipative capacitor.

2. The ESD mitigation structure of claim 1, wherein the resistance of the voltage dependent resistive material is inversely proportional to the excess voltage and wherein the voltage dependent resistive material restores to a capacitive and nonconductive state when the excess voltage is depleted.

3. The ESD mitigation structure of claim 1, wherein the voltage dependent resistive material dissipates the excess voltage into thermal energy.

4. The ESD mitigation structure of claim 1, wherein the voltage dependent resistive material comprises carbon nanotubes.

5. The ESD mitigation structure of claim 1, wherein the nonconductive dielectric is polyethylene, polycarbonate, Mylar, plastic, glass fiber laminates, or paper fibers.

6. The ESD mitigation structure of claim 1, wherein the dissipative dielectric layer is FR1, FR2, or unfired ceramic.

7. A ESD mitigation structure, comprising:
a plurality of parallel plate dissipative capacitors in series to an electronic device forming voltage dividers to the electronic device, wherein the plurality of dissipative capacitors each include a first conductive layer and a second conductive layer that sandwich a dissipative dielectric layer, wherein the dissipative dielectric layer includes a nonconductive dielectric doped with a voltage dependent resistive material, wherein the concentration of the voltage dependent resistive material defines the conductive threshold voltage, and wherein the ESD damage is mitigated when an excess voltage above the conductive threshold voltage is applied to the parallel plate dissipative capacitor.

8. The ESD mitigation structure of claim 7, wherein the resistance of the voltage dependent resistive material is inversely proportional to the excess voltage and wherein the voltage dependent resistive material restores to a capacitive and nonconductive state when the excess voltage is depleted.

9. The ESD mitigation structure of claim 7, wherein the voltage dependent resistive material dissipates the excess voltage into thermal energy.

10. The ESD mitigation structure of claim 7, wherein the voltage dependent resistive material comprises carbon nanotubes.

11. The ESD mitigation structure of claim 7, wherein the nonconductive dielectric is polyethylene, polycarbonate, Mylar, plastic, glass fiber laminates, or paper fibers.

12. The ESD mitigation structure of claim 7, wherein the dissipative dielectric layer is FR1, FR2, or unfired ceramic.

13. A method to mitigate ESD damage to an electronic device or shield against EMI/RFI, comprising:
forming a parallel plate dissipative capacitor wherein the capacitor includes a first and second conductive layer sandwiching a nonconductive dielectric doped with a voltage dependent resistive material and wherein the concentration of the voltage dependent resistive material defines a conductive threshold voltage;
forming a voltage divider by placing the parallel plate dissipative capacitor in series to the electronic device; and
dissipating an ESD voltage exceeding the conductive threshold voltage into thermal energy.

\* \* \* \* \*